US007472320B2

(12) United States Patent
Berndlmaier et al.

(10) Patent No.: US 7,472,320 B2
(45) Date of Patent: Dec. 30, 2008

(54) AUTONOMOUS SELF-MONITORING AND CORRECTIVE OPERATION OF AN INTEGRATED CIRCUIT

(75) Inventors: Zachary E. Berndlmaier, Newburg, NY (US); Stephen F. Geissler, Underhill, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 331 days.

(21) Appl. No.: 10/708,316

(22) Filed: Feb. 24, 2004

(65) Prior Publication Data

US 2005/0188289 A1    Aug. 25, 2005

(51) Int. Cl.
G01R 31/28    (2006.01)
G06F 11/00   (2006.01)

(52) U.S. Cl. .................................. 714/724; 714/704

(58) Field of Classification Search ................. 714/726, 714/704, 710–718, 724
See application file for complete search history.

(56) References Cited

U.S. PATENT DOCUMENTS

| | | | | |
|---|---|---|---|---|
| 3,517,171 A | * | 6/1970 | Avizienis ....................... 714/10 |
| 3,761,882 A | * | 9/1973 | Bartlett et al. ................. 700/24 |
| 4,275,464 A | * | 6/1981 | Schmidt ........................ 714/46 |
| 4,471,484 A | * | 9/1984 | Sedmak ........................ 714/738 |
| 4,634,110 A | | 1/1987 | Julich et al. |
| 5,157,664 A | * | 10/1992 | Waite .......................... 714/710 |
| 5,263,032 A | * | 11/1993 | Porter et al. ................. 714/764 |
| 5,325,397 A | * | 6/1994 | Scholz et al. ................ 375/224 |
| 5,465,053 A | * | 11/1995 | Edwards ...................... 324/770 |
| 5,588,111 A | | 12/1996 | Cutts, Jr. et al. |
| 6,084,541 A | | 7/2000 | Sayegh |
| 6,115,157 A | * | 9/2000 | Barnard et al. ................. 398/1 |
| 6,249,892 B1 | | 6/2001 | Rajsuman et al. |
| 6,307,899 B1 | * | 10/2001 | Starr et al. ................... 375/340 |
| 6,487,352 B1 | * | 11/2002 | Sobiski et al. ............... 385/122 |
| 6,829,737 B1 | * | 12/2004 | McBride ...................... 714/718 |
| 6,877,117 B1 | * | 4/2005 | Childers et al. ............. 714/704 |
| 7,127,647 B1 | * | 10/2006 | Zorian et al. ................ 714/711 |
| 2002/0006676 A1 | | 1/2002 | Debenham et al. |
| 2002/0056063 A1 | * | 5/2002 | Nerl ........................... 714/733 |

FOREIGN PATENT DOCUMENTS

EP    785610 A2 *    7/1997

OTHER PUBLICATIONS

IBM TDB NN9211102 Method of Applying, Monitoring and Recording Multiple Test Criteria vol. 35 Issue 6 p. 102-114 Pub Date Nov. 1, 1992.*

* cited by examiner

*Primary Examiner*—Cynthia Britt
(74) *Attorney, Agent, or Firm*—Gibb & Rahman, LLC; Michael LeStrange, Esq.

(57) ABSTRACT

Disclosed is a method and apparatus for autonomously self-monitoring and self-adjusting the operation of an integrated circuit device throughout the integrated circuit device's useful life. The invention periodically performs performance self-testing on the integrated circuit device throughout the integrated circuit devices useful life. The invention also evaluates whether results from the self-testing are within acceptable limits and self-adjusts parameters of the integrated circuit device until the results from the self-testing are within the acceptable limits.

27 Claims, 3 Drawing Sheets

AUTONOMOUS SELF-MONITORING AND CORRECTIVE OPERATION OF AN INTEGRATED CIRCUIT

BACKGROUND OF INVENTION

1. Field of the Invention

The present invention relates to a method and structure to continuously evaluate microprocessor performance in the field and alter the parameters of the integrated circuit as performance degrades.

2. Description of the Related Art

Currently an additional amount of margin (additional guardband) is added to the performance criteria of every part when it is tested at the end of the manufacturing process. This assumes that each part is going to be negatively influenced by the degrade in performance, which is not realistic because the chip will only need the added margin if the critical path(s) are negatively effected, which does not always occur. The invention described below addresses these issues.

SUMMARY OF INVENTION

The invention provides a method and apparatus for autonomously self-monitoring and self-adjusting the operation of an integrated circuit device throughout the integrated circuit device's useful life. The invention periodically performs performance self-testing on the integrated circuit device throughout the integrated circuit device's useful life. The invention also evaluates whether results from the self-testing are within acceptable limits and self-adjusts parameters of the integrated circuit device until the results from the self-testing are within the acceptable limits.

The performance self-testing can be, for example, built-in self testing (BIST), functional testing, or similar testing. For example, the invention can loop through functional test sequences until failure, and then evaluate the results by comparing the failure criteria, i.e. frequency, temperature, etc. against predetermined limits. In order to self-adjust the circuit, the invention can alter the voltage supplied to portions of the integrated circuit device by, for example, activating electronic fuses to permanently change the parameters of voltage regulators. Also, the invention can maintain a history of adjustments made to the circuit's parameters that can be read or uploaded later.

The invention thereby provides a self-monitoring and self-correcting integrated circuit device. Such a device includes a self-testing controller adapted to periodically perform performance self-testing on the integrated circuit device throughout the useful life of the integrated circuit device, a comparator adapted to evaluate whether results from the self-testing are within acceptable limits, and a parameter processor adapted to permanently self-adjust parameters of the integrated circuit device until the results from the self-testing are within the acceptable limits.

The inventive device can include built-in self test (BIST) units, functional testing units, etc. Such a functional testing unit can apply functional test sequences to the integrated circuit device until failure, and a comparator can be used to compare the failure frequency against predetermined limits. The processor adjusts the parameters by, for example, altering the voltage supplied to portions of the integrated circuit device. Thus, for example, the processor can activate electronic fuses to permanently change the parameters of the voltage produced by voltage regulators. This structure can also include a permanent storage device adapted to maintain a history of adjustments made to the parameters by the processor.

By periodically checking performance characteristics of the integrated circuit device, the invention is able to recognize when the performance of the device begins to degrade or for wear out mechanisms (such as hot electron carriers) and make appropriate parameter changes to compensate for performance degradation.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which.

DETAILED DESCRIPTION

Figure 1:
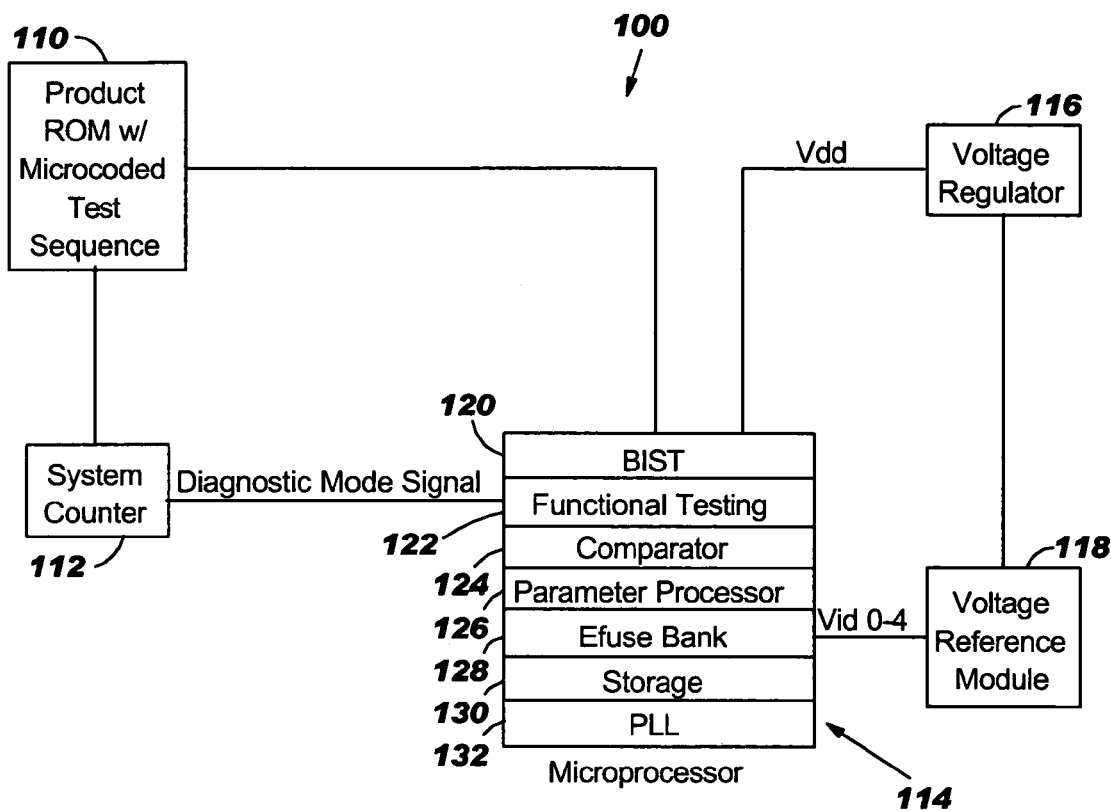
FIG. 1 is a schematic diagram of a system illustrating the invention.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

As shown in FIG. 1, the invention provides a self-monitoring and self-correcting integrated circuit device 100. This structure 100 is designed to enable on-chip performance self-testing periodically and/or during each boot up. Such a device includes a self-testing controller 114 (e.g., microprocessor) adapted to periodically perform performance self-testing on the integrated circuit device throughout the useful life of the integrated circuit device. The controller 110 can also include built-in self test (BIST) units 120 (part of which can be located within the processor and part of which can be located within the components themselves), functional testing units 122, etc. For many microprocessors this could constitute using AC LBIST (via On Product Clock Generation) and ABIST. A comparator 124 (which can be part of, or separate from the controller 114) evaluates whether results from the self-testing are within acceptable limits. A parameter processor 126 permanently self-adjusts parameters of the integrated circuit device until the results from the self-testing are within the acceptable limits. Item 110 represents the product being tested.

In one example, the functional testing unit 122 can apply functional test sequences to the integrated circuit device until failure, and the comparator 124 can be used to compare the failure frequency against predetermined limits. The parameter processor 126 adjusts the parameters by, for example, altering the voltage supplied to portions of the integrated circuit device. Thus, for example, the parameter processor 126 can activate electronic fuses (efuses) 128 in a bank to permanently change the parameters of the voltage produced by voltage regulators 116 (e.g., by affecting the voltage reference module 118). This structure can also include permanent storage 130 (e.g., ROM internal or external to the microprocessor 114) adapted to maintain a history of adjustments made to the parameters by the processor. This storage 130 can be accessed (e.g., read or uploaded) later to gather statistics regarding common failures of specific designs.

Figure 2:
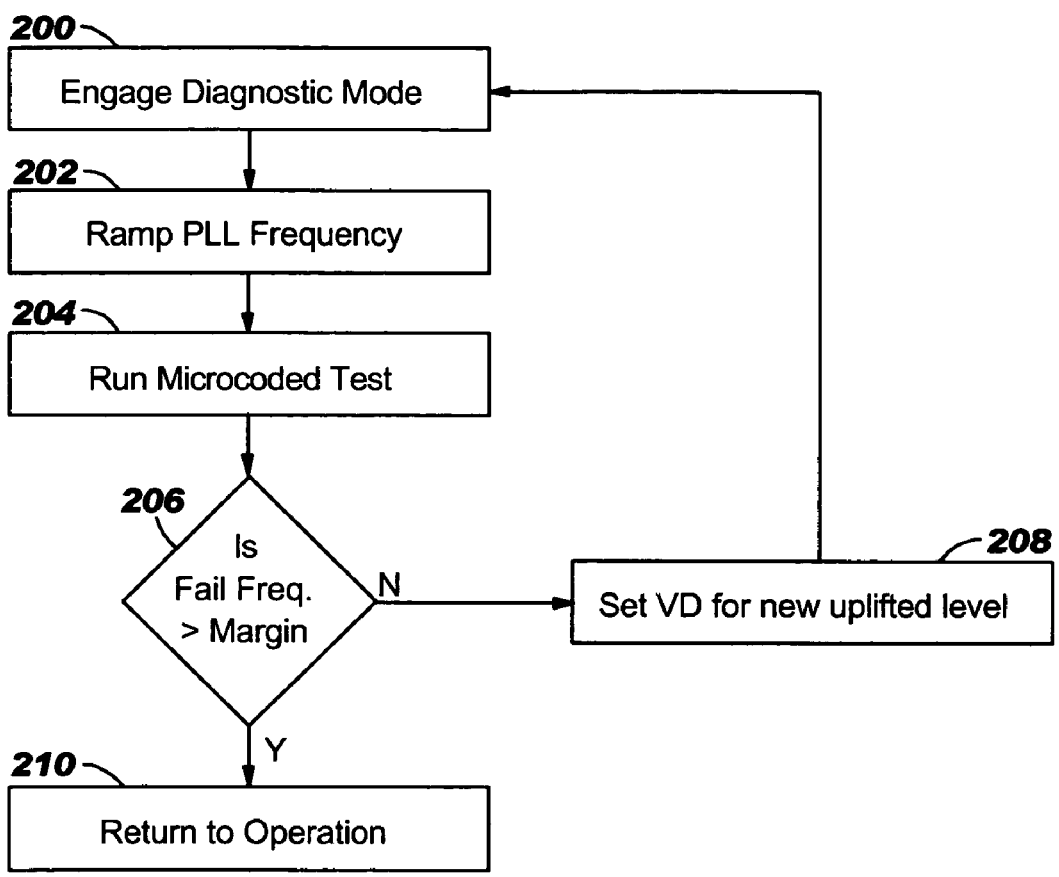
FIG. 2 is a flow diagram illustrating a preferred method of the invention.

FIG. 2 illustrates the processing details of one exemplary functional test flow where the invention enables performance margin self-testing in the field through microcoded functional patterns. In this example, the functional patterns that are performance critical can be identified and microcoded onto either the product 110 or system ROM 130. Either the microprocessor 114 or a system counter 112 keeps a count of time to identify specific intervals of when to launch a performance diagnostic routine 200. During this time, a spread spectrum phase lock loop (PLL) 132 can be ramped up to a lock frequency from an original set point 202. During this time when the PLL frequency is rising, the microprocessor loops on the microcoded functional test sequences until failure 204. Typically, the ramp time for the spread spectrum PLL is on the order of a hundred microseconds, which would provide sufficient time for testing, after which the PLL 132 would return to the original functional lock frequency.

The failure frequency is then compared against a predetermined limit for acceptable margin 206. If the fail frequency exceeds the criteria then no action is taken 210. If the margin does not exceed the performance criteria then a bit is set within a voltage regulation bank of efuses 208. Thus, if the available margin is not acceptable 206, the microprocessor would communicate the need for an uplift of voltage 208 from the off chip regulator 116. This bank of fuses 128 is used during final test to determine the voltage range that the external regulator 116 needs to supply. Industry available regulators read values called the VID (voltage ID) from the microprocessor and set their output levels accordingly. Using efuse technology, if a part fails the test of performance margin requirements, the next voltage level bit is blown into the efuses which, in turn, drives the voltage regulator 116 to a higher state. For example, some voltage regulators change in 25 mV incremental steps.

Figure 3:
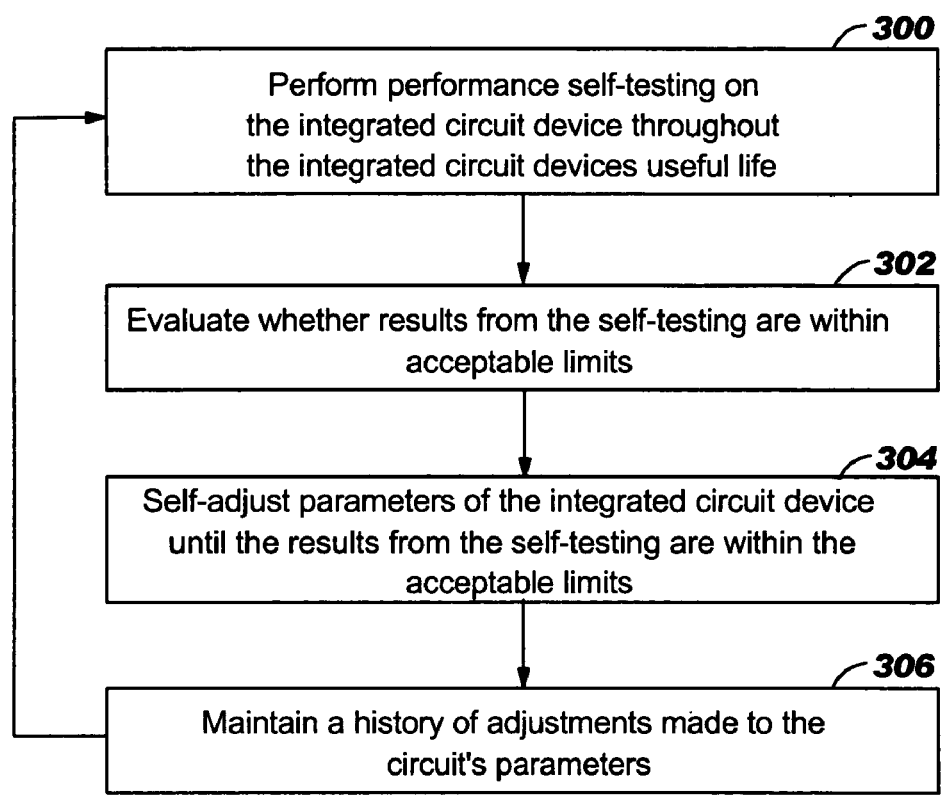
FIG. 3 is a flow diagram illustrating a preferred method of the invention.

FIG. 3 illustrates a more general flow of the autonomously self-monitoring and self-adjusting operation of the integrated circuit device throughout the integrated circuit device's useful life inventive system. More specifically, in item 300, the invention periodically performs performance self-testing on the integrated circuit device throughout the integrated circuit devices useful life. The invention also evaluates whether results from the self-testing are within acceptable limits 302 and self-adjusts parameters of the integrated circuit device until the results from the self-testing are within the acceptable limits 304. One parameter that can be adjusted is the voltage supplied to the various components, as discussed above. However, the invention is not limited to merely adjusting the voltage, and the invention can also adjust a number of different parameters such as the delay (by engaging or disengaging various latches, again through the use of fuses), processing speed (by adjusting the various multipliers), thermal cooling required (by adjusting the integrated circuits fan speed), repair initiation (by engaging, for example, spare array redundant structures), etc. As discussed above, the performance self-testing 300 can be, for example, built-in self testing (BIST), functional testing, or similar testing. For example, the invention can loop through functional test sequences until failure, and then evaluate the results by comparing the failure frequency against predetermined limits. In order to self-adjust the circuit 304, the invention can alter the voltage supplied to portions of the integrated circuit device by, for example, activating electronic fuses to permanently change the parameters of voltage regulators. Also, the invention can maintain a history of adjustments made to the circuit's parameters 306 that can be read or uploaded later. Processing then loops back to the periodic self-testing 300.

One advantage of this methodology is the elimination the added performance requirement (additional guardband) at final manufacturing test, which can be 1-3%. In other words, before the invention is completed, a compensating performance increase (e.g., by increasing voltage, increasing acceptable delay times, thermal margin, frequency margin, etc.), that were not necessary in defect free devices. However, as the device performance degrades over the device's useful life, such compensating performance increases (guardband) would allow the device to continue to operate effectively. Unfortunately, sometimes the compensating performance increase was not sufficient to overcome the performance degradation and sometimes the compensate performance increase was unnecessary; in that the device's performance never degraded to the point that was forecast. These (sometimes unnecessary or ineffective) compensating performance increases (guardband) decrease the overall performance of the device and increase its manufacturing cost. By eliminating the need for these forecasted compensating performance increases, the invention allows the device to be made less expensively and to provide increased performance (at least initially).

This inventive self-checking and self-adjusting process could continue over the lifetime of the product provided the fuses could be set appropriately and that the voltage would not challenge the maximum voltage of parts. By periodically checking performance characteristics of the integrated circuit device, the invention is able to recognize when the performance of the device begins to degrade (such as increases in hot electron carriers) and make appropriate parameter changes to compensate for performance degradation.

Additional applications where this invention could be applied are the thermal compensation required for an individual integrated circuit. For example, in the design of a complex computer system many variables are set at fixed points to allow for a solution. Often these fixed points are at the worst possible level and components are statically fixed for operation in these conditions. However each system will be in a different environment and the margin built into the system may cost the user in a variety of ways. Thermal control is often achieved through the use of fans which can be very loud. By autonomously testing the system in a field, self correction could be achieved and the overall noise generated by the fan could be optimized.

In another application it must be considered that not only does wear out effect performance but it can affect overall functionality. An example that uses common circuitry already available on many designs would be to test the functionality of the memory of an integrated circuit. During manufacturing testing defective section of memory can be replaced through the use of spare (or redundant) memory elements. Similarly, the faulty function of memory in the field could be replaced by redundant memory through autonomous testing and the use of efuse technology to enable and disable the memory components.

While the invention has been described in terms of preferred embodiments, those skilled in the art will recognize that the invention can be practiced with modification within the spirit and scope of the appended claims.

What is claimed is:

1. An autonomously self-monitoring and self-correcting integrated circuit device comprising:
    a self testing controller that periodically and autonomously performs on-chip performance self-testing of said integrated circuit device, said performance self-testing comprising autonomous application of functional test sequences to said integrated circuit device until failure;
    a comparator that evaluates whether results from said self testing are within acceptable limits; and
    a processor that autonomously adjusts parameters of said integrated circuit device until said results from said self-testing are within said acceptable limits.

2. The integrated circuit in claim 1, further comprising one or more of a built-in self test (BIST) unit and a functional testing unit.

3. The integrated circuit in claim 2, said functional testing unit applies said functional test sequences to said integrated circuit device until failure, and said comparator compares the failure frequency against predetermined limits.

4. The integrated circuit in claim 1, said processor further adjusts said parameters by altering the voltage supplied to portions of said integrated circuit device.

5. The integrated circuit in claim 1, further comprising electronic fuses, said processor further activates said electronic fuses to permanently change said parameters of said integrated circuit device.

6. The integrated circuit in claim 1, said processor further adjusts said parameters by permanently altering the voltage produced by voltage regulators.

7. The integrated circuit in claim 1, further comprising a permanent storage device that maintains a history of adjustments made to said parameters by said processor.

8. An autonomously self-monitoring and self-correcting integrated circuit device comprising:
    a self testing controller that periodically performs on-chip performance self-testing of said integrated circuit device throughout the useful life of said integrated circuit device, said performance self-testing comprising application of functional test sequences to said integrated circuit device until failure;
    a comparator that evaluates whether results from said self testing are within acceptable limits; and
    a processor that permanently self-adjusts parameters of said integrated circuit device by altering the voltage supplied to portions of said integrated circuit device until said results from said self-testing are within said acceptable limits.

9. The integrated circuit in claim 8, further comprising one or more of a built-in self test (BIST) unit and a functional testing unit.

10. The integrated circuit in claim 9, said functional testing unit applies said functional test sequences to said integrated circuit device until failure, and said comparator compares the failure frequency against predetermined limits.

11. The integrated circuit in claim 8, further comprising electronic fuses, said processor further activates said electronic fuses to permanently change said parameters of said integrated circuit device.

12. The integrated circuit in claim 8, said processor further adjusts said parameters by permanently altering the voltage produced by voltage regulators.

13. The integrated circuit in claim 8, further comprising a permanent storage device that maintains a history of adjustments made to said parameters by said processor.

14. A method of continuously and autonomously self-monitoring and self-adjusting the operation of an integrated circuit device, said method comprising:
    periodically performing, by said integrated circuit device, on-chip performance self-testing of said integrated circuit device,
        said integrated circuit device comprises a product to be tested and
        said performing of said performance self-testing comprises applying functional test sequences to said integrated circuit device until failure;
    self-evaluating, by said integrated circuit device, whether results from said self-testing are within acceptable limits; and
    self-adjusting, by said integrated circuit device, parameters of said integrated circuit device until said results from said self-testing are within said acceptable limits.

15. The method in claim 14, said performance testing comprising one of built-in self testing (BIST) and functional testing.

16. The method in claim 15, said functional testing comprising looping through functional test sequences until failure, and said evaluating of said results compares the failure frequency against predetermined limits.

17. The method in claim 14, said process of adjusting said parameters comprises altering the voltage supplied to portions of said integrated circuit device.

18. The method in claim 14, said process of adjusting said parameters comprises activating electronic fuses to permanently change said parameters of said integrated circuit device.

19. The method in claim 14, said process of adjusting said parameters comprises permanently altering the voltage produced by voltage regulators.

20. The method in claim 14, further comprising maintaining a history of adjustments made to said parameters during said adjusting process.

21. A method of continuously and autonomously self-monitoring and self-adjusting the operation of an integrated circuit device throughout the useful life of said integrated circuit device, said method comprising:
    periodically performing, by said integrated circuit device, on-chip performance self-testing of said integrated circuit device throughout said useful life of said integrated circuit device,
        said integrated circuit device comprises a product to be tested and
        said performing of said performance self-testing comprises applying functional test sequences to said integrated circuit device until failure;
    self-evaluating, by said integrated circuit device, whether results from said self-testing are within acceptable limits; and
    permanently self-adjusting, by said integrated circuit device, parameters of said integrated circuit device by altering the voltage supplied to portions of said integrated circuit device until said results from said self-testing are within said acceptable limits.

22. The method in claim 21, said performance self testing comprising one of built-in self testing (BIST) and functional testing.

23. The method in claim 22, said functional testing comprising looping through functional test sequences until failure, and said evaluating of said results compares the failure frequency against predetermined limits.

24. The method in claim 21, said process of self-adjusting said parameters comprises altering the voltage supplied to portions of said integrated circuit device.

25. The method in claim 21, said process of self-adjusting said parameters comprises activating electronic fuses to permanently change said parameters of said integrated circuit device.

26. The method in claim 21, said process of self-adjusting said parameters comprises permanently altering the voltage produced by voltage regulators.

27. The method in claim 21 further comprising maintaining a history of adjustments made to said parameters during said self-adjusting process.

* * * * *